(12) United States Patent
Murata et al.

(10) Patent No.: US 8,845,262 B2
(45) Date of Patent: Sep. 30, 2014

(54) SUBSTRATE PROCESSING APPARATUS, SUBSTRATE PROCESSING METHOD AND STORAGE MEDIUM STORING SUBSTRATE PROCESSING PROGRAM

(75) Inventors: Akira Murata, Kumamoto (JP); Issei Ueda, Kumamoto (JP); Osamu Kuroda, Kumamoto (JP); Kouji Kimoto, Kumamoto (JP); Masahiro Yoshida, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 654 days.

(21) Appl. No.: 13/159,519

(22) Filed: Jun. 14, 2011

(65) Prior Publication Data
US 2011/0311340 A1    Dec. 22, 2011

(30) Foreign Application Priority Data
Jun. 16, 2010    (JP) ................................. 2010-137603

(51) Int. Cl.
*H01L 21/677*   (2006.01)
*B25J 9/00*   (2006.01)
*H01L 21/67*   (2006.01)

(52) U.S. Cl.
CPC .... *H01L 21/67742* (2013.01); *H01L 21/67178* (2013.01); *H01L 21/67754* (2013.01)
USPC ................. 414/226.01; 414/222.01

(58) Field of Classification Search
CPC .............. H01L 21/67; H01L 21/67005; H01L 21/67011; H01L 21/67017; H01L 21/67155; H01L 21/67161; H01L 21/67173; H01L 21/677; H01L 21/67703; H01L 621/67739; H01L 21/67742; H01L 21/67754

USPC ................................ 414/222.01, 222.09, 806
See application file for complete search history.

(56) References Cited

U.S. PATENT DOCUMENTS

| | | | | |
|---|---|---|---|---|
| 5,364,222 A | * | 11/1994 | Akimoto et al. | 414/416.03 |
| 5,460,478 A | * | 10/1995 | Akimoto et al. | 414/811 |
| 5,664,254 A | * | 9/1997 | Ohkura et al. | 396/612 |
| 6,161,969 A | * | 12/2000 | Kimura et al. | 396/611 |
| 6,299,363 B1 | * | 10/2001 | Ueda | 396/611 |
| 6,593,045 B2 | * | 7/2003 | Sato et al. | 430/30 |
| 7,877,895 B2 | * | 2/2011 | Otsuka et al. | 34/78 |
| 2011/0150607 A1 | * | 6/2011 | Hong et al. | 414/222.01 |

FOREIGN PATENT DOCUMENTS

| | | | |
|---|---|---|---|
| JP | 2008-034490 A | 2/2008 | |
| WO | WO 2010024511 A1 | * 3/2010 | H01L 21/677 |

* cited by examiner

*Primary Examiner* — Saul Rodriguez
*Assistant Examiner* — Brendan Tighe
(74) *Attorney, Agent, or Firm* — Pearne & Gordon LLP (57) ABSTRACT

A substrate processing apparatus includes a substrate transit table configured to mount thereon a plurality of substrates; a substrate processing chamber configured to process the substrate one by one; a substrate transfer device capable of loading the substrate into the substrate processing chamber from the substrate transit table and unloading the substrate from the substrate processing chamber to the substrate transit table; and N number of (N is an integer equal to or larger than 3) substrate holding devices provided at the substrate transfer device and configured to hold the substrates one by one. Here, a multiplicity of (2 to N−1 number of) substrates are concurrently held by 2 to N−1 number of substrate holding devices among the N number of substrate holding devices and one substrate is loaded into the substrate processing chamber.

16 Claims, 5 Drawing Sheets

SUBSTRATE PROCESSING APPARATUS, SUBSTRATE PROCESSING METHOD AND STORAGE MEDIUM STORING SUBSTRATE PROCESSING PROGRAM

CROSS-REFERENCE TO RELATED APPLICATION

This application claims the benefit of Japanese Patent Application No. 2010-137603 filed on Jun. 16, 2010, the entire disclosures of which are incorporated herein by reference.

FIELD OF THE INVENTION

The present disclosure relates to a substrate processing apparatus, a substrate processing method and a storage medium storing a substrate processing program and, more particularly, to a substrate processing apparatus and a substrate processing method for processing substrates one by one in a substrate processing chamber after transferring the substrates into the substrate processing chamber by using a substrate transfer device having a multiple number of substrate holding devices for holding the substrates one by one and a storage medium storing a substrate processing program.

BACKGROUND OF THE INVENTION

Conventionally, in a manufacturing process of a semiconductor device, a flat display, or the like, a single-substrate processing apparatus has been used to perform a cleaning process or an etching process on a substrate such as a semiconductor wafer or a liquid crystal substrate.

In such a single-substrate processing apparatus, a substrate transfer chamber elongated in a forward/backward direction is formed at a central portion of a rectangular box-shaped case, and a multiple number of substrate processing chambers are arranged at left and right sides of the substrate transfer chamber in the forward/backward direction.

In this substrate processing apparatus, substrates are loaded one by one into each processing chamber by using a substrate transfer device provided in the substrate transfer chamber, and after the substrates are processed one by one in each substrate processing chamber, the processed substrates are unloaded from each substrate processing chamber one by one by using the substrate transfer device (see, for example, Patent Document 1).

Patent Document 1: Japanese Patent Laid-open Publication No. 2008-34490

In the aforementioned conventional substrate processing apparatus, however, since the substrates are transferred one by one by the substrate transfer device, it takes a long time to complete the transfer of the substrates in the substrate processing apparatus.

Thus, in the substrate processing apparatus, it has been required to improve throughput of substrate processing by shortening the time required for the transfer of the substrates.

As a means to reduce the time required for the transfer of the substrates, it might be considered to increase a moving speed of the substrate transfer device. However, since the substrate transfer device should transfer the substrates while allowing the substrates to be stably held thereon, there has been a limit in increasing the moving speed of the substrate transfer device.

BRIEF SUMMARY OF THE INVENTION

In view of the foregoing, in accordance with one aspect of the present disclosure, there is provided a substrate processing apparatus including: a substrate transit table configured to mount thereon a plurality of substrates; a substrate processing chamber configured to process the substrate one by one; a substrate transfer device capable of loading the substrate into the substrate processing chamber from the substrate transit table and unloading the substrate from the substrate processing chamber to the substrate transit table; and N number of (N is an integer equal to or larger than 3) substrate holding devices provided at the substrate transfer device and configured to hold the substrates one by one. Here, a multiplicity of (2 to N−1 number of) substrates may be concurrently held by 2 to N−1 number of substrate holding devices among the N number of substrate holding devices and one substrate may be loaded into the substrate processing chamber.

In accordance with another aspect of the present disclosure, there is provided a substrate processing method for transferring, between a substrate transit table configured to mount thereon a plurality of substrates and a substrate processing chamber for processing the substrate one by one, the substrates by using a substrate transfer device having at least N number of (N is an integer equal to or larger than 3) substrate holding devices for holding the substrates one by one. The substrate processing method includes concurrently holding a multiplicity of (2 to N−1 number of) substrates and loading one substrate into the substrate processing chamber by 2 to N−1 number of substrate holding devices among the N number of substrate holding devices.

In accordance with still another aspect of the present disclosure, there is provided a storage medium storing a substrate processing program for transferring, between a substrate transit table configured to mount thereon a plurality of substrates and a substrate processing chamber for processing the substrate one by one, the substrate by using a substrate transfer device having at least N number of (N is an integer equal to or larger than 3) substrate holding devices for holding the substrates one by one. Here, a multiplicity of (2 to N−1 number of) substrates may be concurrently held by 2 to N−1 number of substrate holding devices among the N number of substrate holding devices and one substrate may be loaded into the substrate processing chamber.

In accordance with the present disclosure, the substrate is transferred into the substrate processing chamber by using the substrate transfer device having the N number of substrate holding devices (N is an integer equal to or larger than 3) for holding the substrates one by one. Further, in order to process the substrate one by one in the substrate processing chamber, the plurality of, i.e., 2 to N−1 number of substrates are concurrently held by the 2 to N−1 number of substrate holding devices among the N number of substrate holding devices and one substrate is loaded into the substrate processing chamber. Accordingly, the time required for the transfer of the substrates can be reduced while throughput of the substrate processing can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, a detailed configuration of a substrate processing apparatus in accordance with the present disclosure will be discussed with reference to the accompanying drawings.

Figure 1:
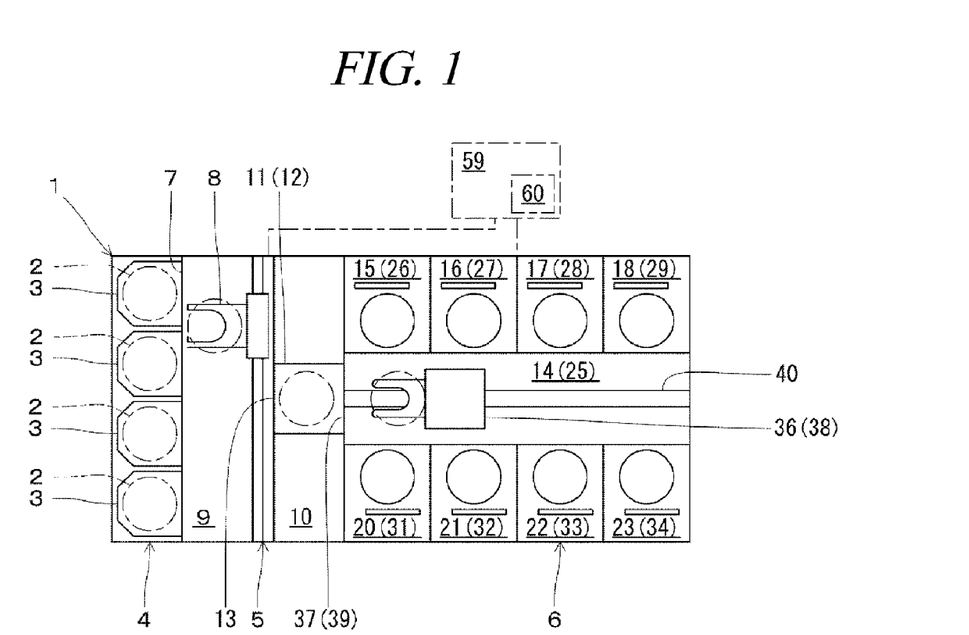
FIG. 1 is a plan view showing a substrate processing apparatus.
Figure 2:
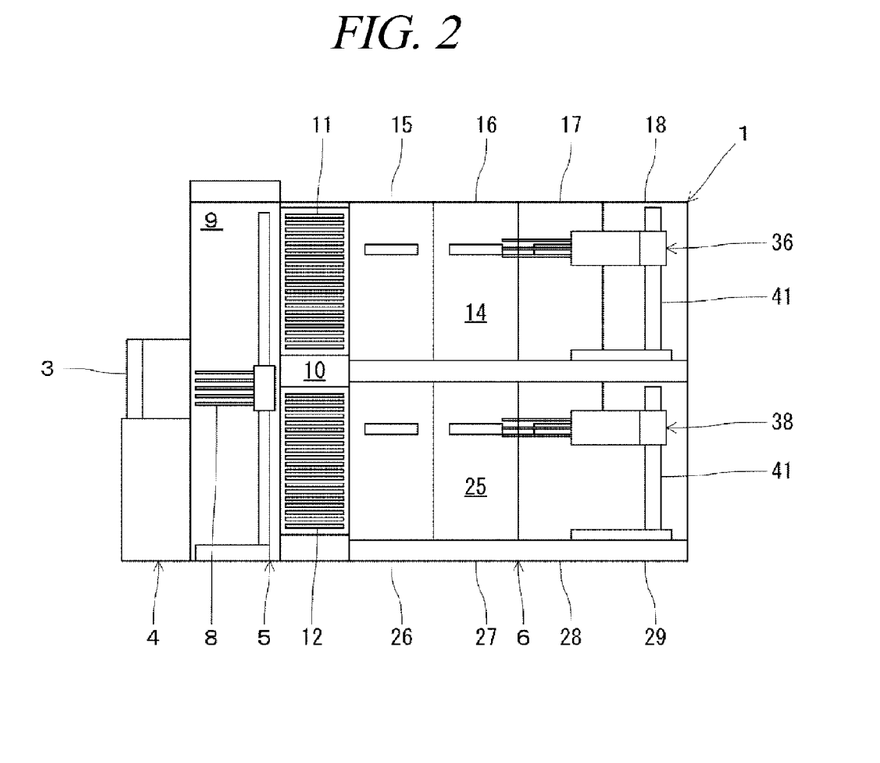
FIG. 2 is a side cross sectional view of the substrate processing apparatus.

As depicted in FIGS. 1 and 2, a substrate processing apparatus 1 may include a substrate loading/unloading table 4 at a front thereof; a rectangular box-shaped substrate transfer unit 5 at the rear of the substrate loading/unloading table 4; and a rectangular box-shaped substrate processing unit 6 at the rear of the substrate transfer unit 5. On the substrate loading/unloading table 4, a multiple number of (e.g., about 25) substrates 2 (here, semiconductor wafers) are loaded and unloaded into and from each of carriers 3 in batch. The substrate transfer unit 5 may transfer the substrates 2 accommodated in each carrier 3. The substrate processing unit 6 performs various processes such as cleaning or drying on the substrates 2.

The substrate loading/unloading table 4 may be configured to mount thereon a multiple number of (here, four) carriers 3 that are in contact with a front wall 7 of the substrate transfer unit 5 at a certain distance in left and right directions.

The substrate transfer unit 5 may include, at a front side thereof, a transfer chamber 9 having therein a transfer device 8; and, at the rear of the transfer chamber 9, a substrate transit chamber 10 accommodating two substrate transit tables 11 and 12 vertically arranged therein. Each of the substrate transit tables 11 and 12 is configured to mount thereon a multiple number of (here, twenty) substrates with a certain vertical gap between the substrates.

In the substrate transfer unit 5, the transfer chamber 9 and the substrate transit chamber 10 may communicate with each other through a transit port 13.

The substrate transfer unit 5 transfers a multiple number of (here, five) substrates 2 in batch by using the transfer device 8 between one of the carriers 3 on the substrate loading/unloading table 4 and one of the upper and lower substrate transit tables 11 and 12.

Here, in the substrate transfer unit 5, as for each of the upper and lower substrate transit tables 11 and 12 capable of mounting twenty sheets of substrates 2 thereon, upper parts for mounting ten sheets of substrates are used to load the substrates into the substrate processing unit 6 from the substrate loading/unloading table 4, while lower parts for mounting the other ten sheets of substrates are used to unload the substrates from the substrate processing unit 6 to the substrate loading/unloading table 4. In this way, it can be avoided that substrates to be processed next in the substrate processing unit 6 and substrates already processed therein are mounted at the same parts of the substrate transit table 11 or 12. Thus, transfer of particles or the like from the unprocessed substrates 2 to the processed substrates 2 can be prevented.

The substrate processing unit 6 may include a first substrate transfer chamber 14 elongated in an upper central region thereof along a forward/backward direction. Further, a first to a fourth substrate processing chamber 15 to 18 may be arranged on the left of the first substrate transfer chamber 14 along the forward/backward direction, and a fifth to an eighth substrate processing chamber 20 to 23 may be arranged on the right of the first substrate transfer chamber 14 along the forward/backward direction.

Furthermore, the substrate processing unit 6 may further include a second substrate transfer chamber 25 that is elongated in a lower central region thereof along the forward/backward direction, like the first substrate transfer chamber 14. A ninth to a twelfth substrate processing chambers 26 to 29 are arranged on the left of the second substrate transfer chamber 25 along the forward/backward direction, and a thirteenth to a sixteenth substrate processing chambers 31 to 34 are arranged on the right of the second substrate transfer chamber 25 along the forward/backward direction.

Here, the first substrate transfer chamber 14 may include a first substrate transfer device 36 configured to be movable in the forward/backward direction, and the first substrate transfer chamber 14 may communicate with the upper substrate transit table 11 of the substrate transit chamber 10 through a first substrate loading/unloading port 37. Further, the second substrate transfer chamber 25 may include a second substrate transfer device 38 configured to be movable in the forward/backward direction, and the second substrate transfer chamber 25 may communicate with the lower substrate transit table 12 of the substrate transit chamber 10 through a second substrate loading/unloading port 39.

Figure 3:
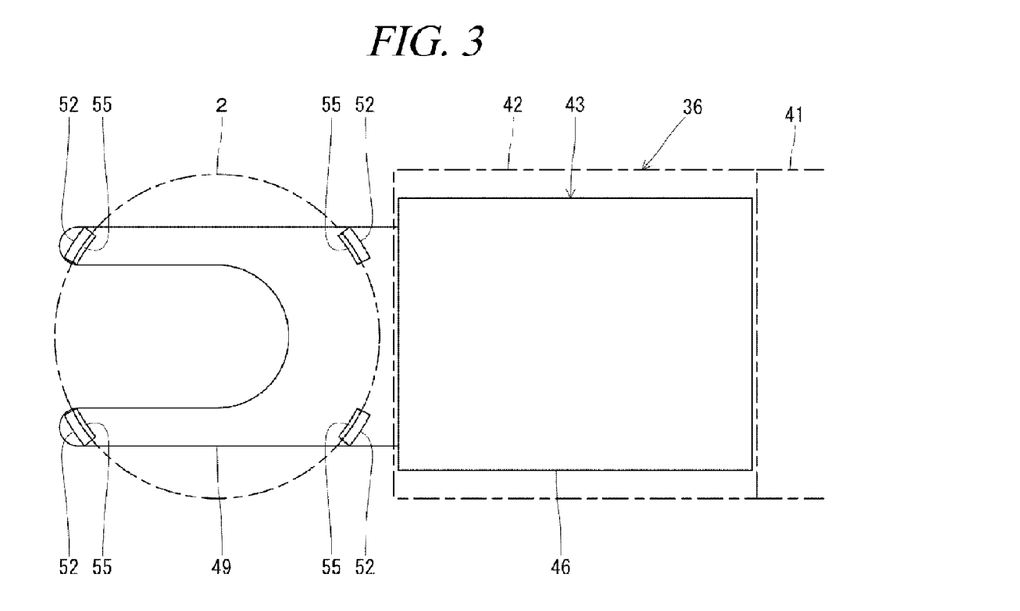
FIG. 3 is a plan view showing a substrate transfer device.
Figure 4:
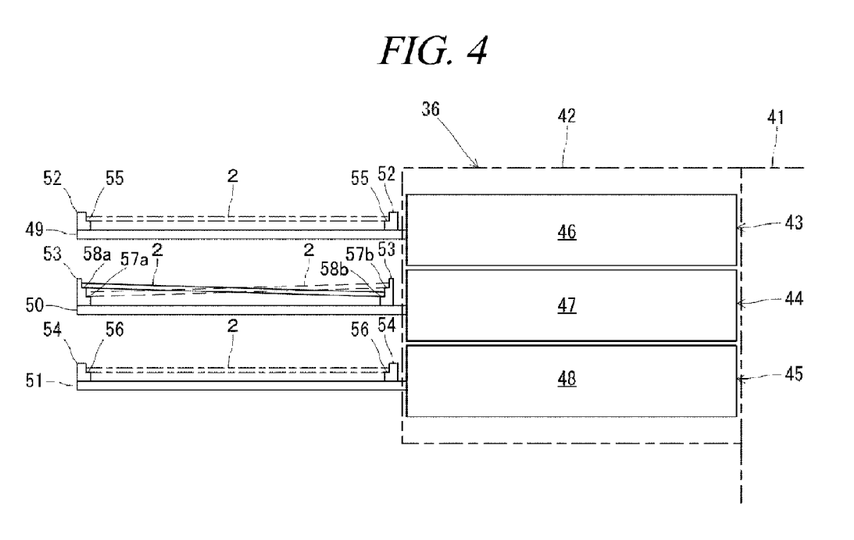
FIG. 4 is a side view of the substrate transfer device.

The first and second substrate transfer devices 36 and 38 have the same configuration, and for the simplicity of explanation, only the configuration of the first substrate transfer device 36 will be elaborated here. As depicted in FIGS. 3 and 4, the substrate transfer device 36 may include a moving member 41 that is configured to be movable by a non-illustrated driving unit along a rail 40 provided in a floor of substrate transfer chamber 14 and has a driving unit for vertically moving the moving member 41. A casing 42 is secured to an upper portion of the moving member 41, and three-stage substrate holding devices 43, 44 and 45 for receiving and transferring substrates W are vertically arranged within the casing 42.

The substrate holding devices 43, 44 and 45 may include driving units 46, 47 and 48; and bifurcated fork-shaped substrate mount bases 49, 50 and 51 secured to front ends of the driving units 46, 47 and 48, respectively, so as to be movable back and forth and up and down. Four substrate supports 52 (53 or 54) for supporting a substrate 2 are provided on a top surface of the substrate mount base 49 (50 or 51) along the circumferential edge of the substrate 2 while being spaced apart from each other along the periphery of the substrate mount base 49 (50 or 51). The driving units 46, 47 and 48 move the substrate mount bases 49, 50 and 51 away from the driving units 46, 47 and 48 or closer to the driving units 46, 47 and 48 (forward/backward direction), respectively.

Here, the substrate supports 52 of the uppermost substrate holding device 43 and the substrate supports 54 of the lowermost substrate holding device 45 are formed in a single step shape. The circumferential edges of the substrates 2 are supported by substrate holding portions 55 and 56, so that the substrates 2 are horizontally held.

The uppermost substrate holding device 43 is used as a substrate holding device 43 for unloading a substrate 2 from each of the substrate processing chambers 15 to 18, 20 to 23, 26 to 29 and 31 to 34. Further, the lowermost substrate holding device 45 is used as a substrate holding device 45 for loading a substrate 2 into each of the substrate processing chambers 15 to 18, 20 to 23, 26 to 29 and 31 to 34. With this configuration, it can be prevented that a substrate 2 is held on the same substrate holding device 43 or 45 before and after it is processed. Thus, transfer of particles or the like from the unprocessed substrate 2 to the processed substrate 2 can be avoided.

Meanwhile, the intermediate substrate holding device 44 is used as a substrate holding device 44 for both loading and unloading a substrate 2 into/from each of the substrate processing chambers 15 to 18, 20 to 23, 26 to 29 and 31 to 34. Each of the substrate supports 53 of the substrate holding device for loading/unloading 44 is formed in a double step shape. To elaborate, substrate holding portions 57a and 57b for holding a substrate 2 when loading the substrate 2 into each of the substrate processing chambers 15 to 18, 20 to 23, 26 to 29 and 31 to 34 and substrate holding portions 58a and 58b for holding the substrate 2 when unloading the substrate 2 from each of the substrate processing chambers 15 to 18, 20 to 23, 26 to 29 and 31 to 34 are arranged in a moving direction (forward/backward direction) of the substrate holding device for loading/unloading 44. The substrate holding portion 57a for loading is formed at a lower step of each substrate support 53 on the front side in the moving direction of the substrate holding device for loading/unloading 44, and the substrate holding portion for loading 57b is formed at an upper step of each substrate support 53 on the rear side in the moving direction of the substrate holding device 44 for loading/unloading.

Further, the substrate holding portion for unloading 58a is formed at an upper step of each substrate support 53 on the front side in the moving direction of the substrate holding device for loading/unloading 44, and the substrate holding portion for unloading 58b is formed at a lower step of each substrate support 53 on the rear side in the moving direction of the substrate holding device for loading/unloading 44. With this configuration, a pitch between the substrate holding portions in the moving direction of the substrate holding device for loading/unloading 44 may be set to be different from a pitch between the substrate holding portions in the moving direction of the substrate holding device for loading 43 and the substrate holding device for unloading 45.

Further, positions of the substrate holding portions in the moving direction of the substrate holding device for loading/unloading 44 may be different from positions of the substrate holding portions in the moving direction of the substrate holding device for loading 43 and the substrate holding device for unloading 45.

Moreover, the range of forward/backward movement of the substrate holding device for loading/unloading 44 is wider than that of the substrate holding device for loading 43 and the substrate holding device for unloading 45. Accordingly, the moving distance of the substrate holding device loading/unloading 44 during loading or unloading may be different from the moving distance of the substrate holding device 43 for loading or the substrate holding device for unloading 45, so that the substrate holding device 44 for loading/unloading can receive a substrate mounted on the same position.

Moreover, as for the intermediate substrate holding device (substrate holding device for loading/unloading) 44, the circumferential edge of the substrate 2 may be supported by the first-level substrate holding portions for loading 57a of the two substrate supports 53 on the front side in the moving direction of the substrate holding device 44 and the second-level substrate holding portions for unloading 57b of the two substrate supports 53 on the rear side in the moving direction of the substrate holding device 44 (indicated by a dashed line in FIG. 4). Further, the circumferential edge of the substrate 2 may be supported by the second-level substrate holding portions for unloading 58a of the two substrate supports 53 on the front side in the moving direction of the substrate holding device 44 and the first-level substrate holding portions for unloading 58b of the two substrate supports 53 on the rear side in the moving direction of the substrate holding device 44 (indicated by a solid line in FIG. 4). That is, the substrate 2 may be held in an inclined manner. In this way, the substrate 2 to be processed next by each of the substrate processing chambers 15 to 18, 20 to 23, 26 to 29 and 31 to 34 may be supported by the first-level substrate holding portions (for loading) 57a of the two substrate supports 53 on the front side and the second-level substrate holding portions 57b (for loading) of the two substrate supports 53 on the rear side. Then, the processed substrate 2 may be supported by the second-level substrate holding portions 57a (for unloading) of the two substrate supports 53 on the front side and the first-level substrate holding portions (for unloading) 58b of the two substrate supports 53 on the rear side. With this configuration, the unprocessed substrate 2 and the processed substrate 2 can be prevented from being supported by the same parts of the substrate supports 53. Thus, transfer of particles or the like between the unprocessed substrate 2 and the processed substrate 2 can be prevented.

In the substrate processing unit 6, substrates W are transferred by using the first or second substrate transfer device 36 or 38 between the substrate transit chamber 10 of the substrate transfer unit 5 and each of the substrate processing chambers 15 to 18, 20 to 23, 26 to 29 and 31 to 34 or between the respective substrate processing chambers 15 to 18, 20 to 23, 26 to 29 and 31 to 34. The substrates 2 are processed one by one in each of the substrate processing chambers 15 to 18, 20 to 23, 26 to 29 and 31 to 34.

The substrate processing apparatus 1 is configured as described above. The transfer device 8 of the substrate transfer unit 5, each of the substrate processing chambers 15 to 18, 20 to 23, 26 to 29 and 31 to 34 of the substrate processing unit 6 and each of the substrate transfer devices 36 and 38 are connected with a controller 59 and controlled according to a substrate processing program stored in a storage medium 60 included in the controller 59.

The substrate transfer devices 36 and 38 are controlled as follows according to the substrate processing program and transfer a multiple number of substrates W at the same time. Further, in the following description, although the operation of only the first substrate transfer device 36 is described for the simplicity of explanation, the second substrate transfer device 38 may be operated in the same manner.

First, according to the substrate processing program, five sheets of substrates 2 are transferred to the substrate transit table 11 from one of the carriers 3 mounted on the substrate loading/unloading table 4 by using the transfer device 8. According to this substrate processing program, as for each of the upper and lower substrate transit tables 11 and 12 capable of accommodating twenty sheets of substrates 2 thereon, upper parts for accommodating ten sheets of substrates are used to load the substrates into the substrate processing unit 6 from the substrate loading/unloading table 4. Further, the ten sheets of substrates to be loaded into the substrate transit table 11 or 12 are divided to two groups, and upper five sheets and lower five sheets of substrates 2 are consecutively transferred to the substrate transit table 11 from one of the carriers 3 mounted on the substrate loading/unloading table 4 by using the transfer device 8.

Figure 5A:
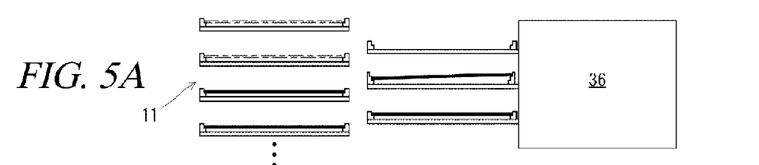
FIG. 5 is a diagram for describing an operation of the substrate transfer device.

Subsequently, according to the substrate processing program, as shown in FIG. 5A, the substrate transfer device 36 is moved to a position directly in front of the substrate transit chamber 10, and two sheets of substrates mounted on the topmost level and its below level of the substrate transit table 11 are received by the intermediate and lowermost substrate holding devices 44 and 45, respectively.

At this time, the intermediate substrate holding device (substrate holding device for loading/unloading) 44 moves forward and backward a longer distance than the lowermost substrate holding device (substrate holding device for loading) 45 and holds the substrate 2 by the first-level substrate holding portions (for loading) 57a of the two substrate supports 53 on the front side and the second-level substrate holding portions (for loading) 57b of the substrate supports 53 on the rear side. The substrate 2 is held in an inclined manner such that its front side is lowered and its rear side is raised (as indicated by the dashed line of FIG. 4).

Figure 5B:
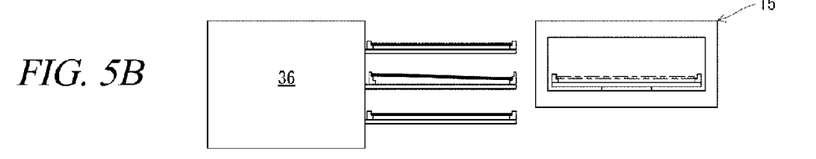

Subsequently, according to the substrate processing program, as depicted in FIG. 5B, the substrate transfer device 36 holding the two substrates 2 thereon is moved to a position directly in front of any one substrate processing chamber (e.g., the first substrate processing chamber 15) and the height of the substrate transfer device 36 is adjusted. Then, a single sheet of substrate 2 processed in the substrate processing chamber 15 is unloaded from the substrate processing chamber 15 by the uppermost substrate holding device 43.

Figure 5C:
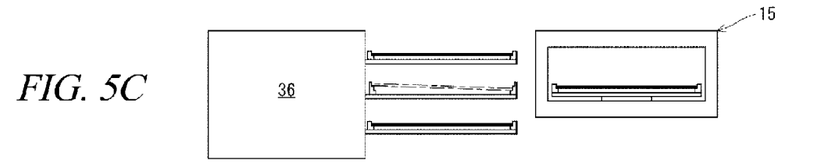

Thereafter, according to the substrate processing program, as shown in FIG. 5C, a single sheet of substrate 2 held by the intermediate substrate holding device 44 of the substrate transfer device 36 is loaded into the substrate processing chamber 15.

At this time, the intermediate substrate holding device (substrate holding device for loading/unloading) 44 moves forward and backward the longer distance than the lowermost substrate holding device (substrate holding device for loading) 45 to be described later (FIG. 5E) and loads, into the substrate processing chamber 15, the substrate 2 held in the inclined manner with its front side lowered and rear side raised by the first-level substrate holding portions (for loading) 57a of the two substrate supports 53 on the front side and the second-level substrate holding portions (for loading) 57b of the substrate supports 53 on the rear side (as indicated by the dashed line of FIG. 4).

Figure 5D:
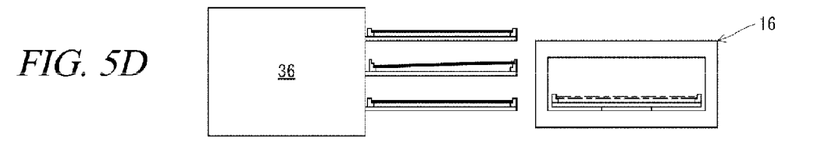

Afterward, according to the substrate processing program, as depicted in FIG. 5D, the substrate transfer device 36 holding the two substrates 2 thereon is moved to a position directly in front of another substrate processing chamber (e.g., the second substrate processing chamber 16) and the height of the substrate transfer device 36 is adjusted. Then, a single sheet of substrate 2 processed in the substrate processing chamber 16 is unloaded from the substrate processing chamber 16 by the intermediate substrate holding device 44.

At this time, the intermediate substrate holding device (substrate holding device for loading/unloading) 44 moves forward and backward a shorter distance than the above-described uppermost substrate holding device (substrate holding device for loading) 43 (FIG. 5B) and holds the substrate 2 by the second-level substrate holding portions (for unloading) 58a of the two substrate supports 53 on the front side and the first-level substrate holding portions (for unloading) 58b of the substrate supports 53 on the rear side. The substrate 2 is held in an inclined manner such that its front side is raised and its rear side is lowered (as indicated by the solid line of FIG. 4).

Figure 5E:
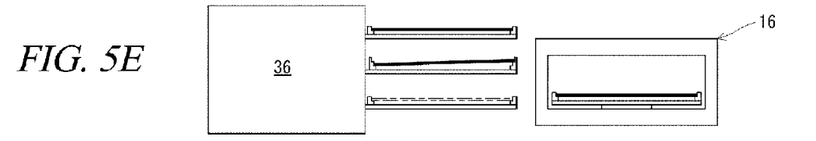

Subsequently, according to the substrate processing program, as shown in FIG. 5E, a single sheet of substrate 2 held by the lowermost substrate holding device 45 of the substrate transfer device 36 is loaded into the substrate processing chamber 16.

Figure 5F:
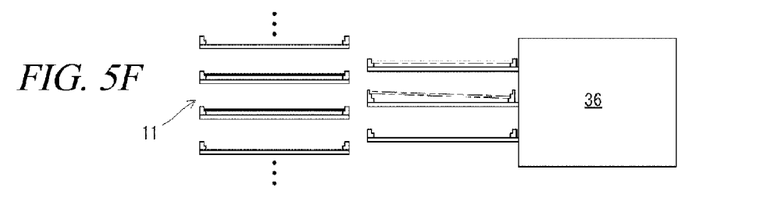

Then, according to the substrate processing program, as illustrated in FIG. 5F, the substrate transfer device 36 is moved to a position directly in front of the substrate transit chamber 10, and the two substrates held by the uppermost and intermediate substrate holding devices 43 and 44 are transferred to the third level and its below level of the substrate transit table 11, respectively.

At this time, the intermediate substrate holding device (substrate holding device for loading/unloading) 44 moves forward and backward the shorter distance than the uppermost substrate holding device (substrate holding device for loading) 43 and unloads onto the substrate transit table 11 the substrate 2 held in the inclined manner with its front side raised and rear side lowered by the second-level substrate holding portions (for unloading) 58a of the two substrate supports 53 on the front side and the first-level substrate holding portions (for unloading) 58b of the substrate supports 53 on the rear side (as indicated by the solid line of FIG. 4).

Thereafter, according to the substrate processing program, by using the transfer device 8, five sheets of substrates 2 are transferred from the substrate transit table 11 to one of the carriers 3 mounted on the substrate loading/unloading table 4. According to this substrate processing program, as for each of the upper and lower substrate transit tables 11 and 12 capable of accommodating twenty sheets of substrates 2 thereon, lower parts for accommodating ten sheets of substrates are used to unload the substrates from the substrate processing unit 6 to the substrate loading/unloading table 4. Further, the ten sheets of substrates to be unloaded from the substrate transit table 11 or 12 are divided to two groups, and upper five sheets and lower five sheets of substrates 2 are consecutively transferred from the substrate transit table 11 to one of the carriers 3 mounted on the substrate loading/unloading table 4 by the transfer device 8.

In the above, the description has been provided for the case of transferring two sheets of substrates 2 concurrently by the substrate transfer device 36 having the three substrate holding devices 43, 44 and 45. However, it may be also possible to transfer 2 to N−1 sheets of substrates 2 at the same time by using a substrate transfer device having a N number of (N is equal to or larger than 3) substrate holding devices.

As discussed above, in the substrate processing method executed by the substrate processing program in the substrate processing apparatus 1, the substrates 2 are transferred into the substrate processing chambers 15 and 16 by using the substrate transfer device 36 having the three substrate holding devices 43, 44 and 45 for holding the substrates 2 one by one and the substrates 2 are processed one by one in the substrate processing chambers 15 and 16. At this time, since two sheets of substrates 2 are concurrently held by the three substrate holding devices 43, 44 and 45 and transferred into each of the processing chambers 15 and 16 one by one, the time required for the transfer of the substrates 2 can be reduced, so that throughput of the substrate processing may be improved.

The number of the substrate holding devices 43, 44 and 45 may not be limited to three, but N number of (N is an integer equal to or larger than 3) substrate holding devices may be provided and 2 to N−1 number of substrates 2 may be concurrently held and transferred. Especially, by transferring the N−1 number of substrates 2 at the same time, the time required for the transfer of the substrates 2 may be further reduced, resulting in a higher throughput of the substrate processing. Moreover, if the N number of substrates 2 were transferred at the same time, a substrate 2 processed in the substrate processing chamber 15 to 18, 20 to 23, 26 to 29 or 31 to 34 would not be unloaded, and loading and unloading of the substrates 2 would not be performed at the same time but should be performed separately. Thus, the time required for the substrates 2 would be rather increased.

Especially, in the above-described substrate transfer device 36 of the substrate processing apparatus 1, among the multiple number of (here, three) substrate holding devices 43, 44 and 45, one substrate holding device 45 is used only for loading a substrate 2 into the substrate processing chamber 15; another substrate holding device 43 is used only for unloading a substrate 2 from the substrate processing chamber 16; and the other substrate holding device 44 is used for both loading and unloading substrates 2 into and from the substrate processing chambers 15 and 16. Thus, the substrate holding device 43 used for loading the substrate and the substrate holding device 45 used for unloading the substrate may have the same structure and, further, the substrate holding device 44 may have a common structure capable of performing both loading and unloading of the substrates. Therefore, the structure of the substrate transfer device 36 may be simplified. Accordingly, assembly or maintenance of the substrate transfer device 36 may be facilitated and cost can be cut.

Furthermore, in the substrate transfer device 36 of the above-described substrate processing apparatus 1, the multiple number of (here, three) substrate holding devices 43, 44 and 45 are vertically arranged, and the uppermost substrate holding device 43 is used only for unloading a substrate 2 from the substrate processing chamber 15. Thus, the uppermost substrate 43 does not hold a substrate 2 to be processed next in the substrate processing chamber 15, and particles adhering to the unprocessed substrate 2 may be prevented from falling down and contaminating and damaging substrates 2 held by the substrate holding devices 44 and 45 below the substrate holding device 43.

Furthermore, in the above-described substrate transfer device 36 of the substrate processing apparatus 1, the multiple number of (here, three) substrate holding devices 43, 44 and 45 are vertically arranged, and among the three substrate holding devices 43, 44 and 45 vertically arranged, one substrate holding device 44 (45) is used to load the substrate 2 into the substrate processing chamber 15 (16) while the other substrate holding device 43 (44) is used to unload the substrate 2 from the substrate processing chamber 15 (16). Thus, a distance by which the substrate transfer device 36 is vertically moved may be shortened, so that the transfer time can be further reduced. Furthermore, if the substrate 2 is loaded into the substrate processing chamber 15 (16) by one substrate holding device 44 (45) and at the same time, the substrate 2 is unloaded from the substrate processing chamber 15 (16) by the other substrate holding device 43 (44) (i.e., both substrate holding devices are positioned in the substrate processing chamber 15 (16)), an opening size of the substrate processing chamber 15 (16) can be reduced, and, thus, the substrate processing chamber 15 (16) can be scaled down.

In addition, in accordance with the above-described substrate processing apparatus 1, since N number of (here, three) or more sheets of substrates (here, five sheets of substrates) are transferred in batch between one of the carriers 3 mounted on the substrate loading/unloading table 4 and one of the substrate transit tables 11 and 12 by the transfer device 8, the time required for the transfer of the substrates 2 can be further reduced, so that the throughput of the substrate processing may be further improved.

What is claimed is:

1. A substrate processing apparatus comprising:
   a substrate transit table configured to mount thereon a plurality of substrates;
   a substrate processing chamber configured to process the substrate one by one;
   a substrate transfer device capable of loading the substrate into the substrate processing chamber from the substrate transit table and unloading the substrate from the substrate processing chamber to the substrate transit table; and
   N number of (N is an integer equal to or larger than 3) substrate holding devices provided at the substrate transfer device and configured to hold the substrates one by one,
   wherein a multiplicity of (M number of) substrates are concurrently held by M number of substrate holding devices from among the N number of substrate holding devices and one substrate is loaded into the substrate processing chamber,
   wherein M is an integer equal to or larger than 2 and smaller than N,
   wherein among the N number of substrate holding devices, at least one substrate holding device is configured as a substrate holding device for both loading and unloading the substrate into and from the substrate processing chamber,
   wherein among the N number of substrate holding devices, at least one another substrate holding device is configured as a substrate holding device for unloading the substrate from the substrate processing chamber,
   wherein the at least one substrate holding device for both loading and unloading the substrate includes substrate supports that support the substrate, and
   wherein the substrate supports include a substrate holding portion for loading and a substrate holding portion for unloading that is different from the substrate holding portion for loading.

2. The substrate processing apparatus of claim 1, wherein among the N number of substrate holding devices, at least one other substrate holding device is configured as a substrate holding device for loading the substrate into the substrate processing chamber.

3. The substrate processing apparatus of claim 2, wherein the substrate holding portion for loading is configured to support the substrates during loading of the substrate and the substrate holding portion for unloading is configured to support the substrate during unloading of the substrates,
   the substrate holding portion for loading and the substrate holding portion for unloading are arranged in a moving direction of the substrate holding device for loading/unloading, and
   a moving distance of the substrate holding device for loading/unloading is set to be different from that of the substrate holding device for loading or the substrate holding device for unloading.

4. The substrate processing apparatus of claim 2, wherein the N number of substrate holding devices are vertically arranged, and
   among two vertically arranged substrate holding devices, one substrate holding device is the substrate holding device for loading the substrate into the substrate processing chamber and the other substrate holding device is the substrate holding device for unloading the substrate from the substrate processing chamber.

5. The substrate processing apparatus of claim 1, wherein the N number of substrate holding devices are vertically arranged, and at least one substrate holding device at a top side is configured as the substrate holding device used only for unloading the substrate from the substrate processing chamber.

6. The substrate processing apparatus of claim 1, further comprising:

a transfer device configured to transfer the M number of or more substrates at the same time between the substrate transit table and a carrier accommodating the plurality of substrates therein.

7. A substrate processing method for transferring, between a substrate transit table configured to mount thereon a plurality of substrates and a substrate processing chamber for processing the substrate one by one, the substrate by using a substrate transfer device having at least N number of (N is an integer equal to or larger than 3) substrate holding devices for holding the substrates one by one, the method comprising:

concurrently holding a multiplicity of (M number of) substrates by M number of substrate holding devices from among the N number of substrate holding devices and loading one substrate into the substrate processing chamber, wherein M is an integer equal to or larger than 2 and smaller than N, wherein among the N number of substrate holding devices, at least one substrate holding device is used for both loading and unloading the substrate into and from the substrate processing chamber, wherein among the N number of substrate holding devices, at least one another substrate holding device is used for unloading the substrate from the substrate processing chamber, wherein the at least one substrate holding device used for both loading and unloading the substrate includes substrate supports that support the substrate, and wherein the substrate supports include a substrate holding portion for loading and a substrate holding portion for unloading that is different from the substrate holding portion for loading.

8. The substrate processing method of claim 7, wherein among the N number of substrate holding devices, at least one other substrate holding device is used for loading the substrate into the substrate processing chamber.

9. The substrate processing method of claim 8, wherein the N number of substrate holding devices are vertically arranged, and one of two vertically arranged substrate holding devices is the substrate holding device used for loading the substrate into the substrate processing chamber and the other one of the two vertically arranged substrate holding devices is the substrate holding device used for unloading the substrate from the substrate processing chamber.

10. The substrate processing method of claim 7, wherein the N number of substrate holding devices are vertically arranged, and the substrate holding device used for unloading the substrate from the substrate processing chamber is positioned at a top side.

11. The substrate processing method of claim 7, further comprising:

transferring the M number of or more substrates concurrently between the substrate transit table and a carrier accommodating the plurality of substrates therein by using a transfer device.

12. A storage medium storing a substrate processing program for transferring, between a substrate transit table configured to mount thereon a plurality of substrates and a substrate processing chamber for processing the substrate one by one, the substrate by using a substrate transfer device having at least N number of (N is an integer equal to or larger than 3) substrate holding devices for holding the substrates one by one, wherein a multiplicity of (M number of) substrates are concurrently held by M number of substrate holding devices from among the N number of substrate holding devices and one substrate is loaded into the substrate processing chamber, wherein M is an integer equal to or larger than 2 and smaller than N, wherein among the N number of substrate holding devices, at least one substrate holding device is used for both loading and unloading the substrate into and from the substrate processing chamber, wherein among the N number of substrate holding devices, at least one another substrate holding device is used for unloading the substrate from the substrate processing chamber, wherein the at least one substrate holding device used for both loading and unloading the substrate includes substrate supports that support the substrate, and wherein the substrate supports include a substrate holding portion for loading and a substrate holding portion for unloading that is different from the substrate holding portion for loading.

13. The storage medium of claim 12, wherein among the N number of substrate holding devices, at least one other substrate holding device is used for loading the substrate into the substrate processing chamber.

14. The storage medium of claim 13, wherein the N number of substrate holding devices are vertically arranged, and one of two vertically arranged substrate holding devices is the substrate holding device used for loading the substrate into the substrate processing chamber and the other one of the two vertically arranged substrate holding devices is the substrate holding device used for unloading the substrate from the substrate processing chamber.

15. The storage medium of claim 12, wherein the N number of substrate holding devices are vertically arranged, and the substrate holding device used for unloading the substrate from the substrate processing chamber is positioned at a top side.

16. The storage medium of claim 12, wherein the M number of or more substrates are transferred concurrently between the substrate transit table and a carrier accommodating the plurality of substrates therein by using a transfer device.

* * * * *